(12) United States Patent
Singh et al.

(10) Patent No.: US 7,604,903 B1
(45) Date of Patent: Oct. 20, 2009

(54) MASK HAVING SIDEWALL ABSORBERS TO ENABLE THE PRINTING OF FINER FEATURES IN NANOPRINT LITHOGRAPHY (1XMASK)

(75) Inventors: Bhanwar Singh, Morgan Hills, CA (US); Srikanteswara Dakshina-Murthy, Wappingers Falls, NY (US); Khoi A. Phan, Santa Jose, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 863 days.

(21) Appl. No.: 10/768,515

(22) Filed: Jan. 30, 2004

(51) Int. Cl.
*G03F 1/00* (2006.01)
*G03F 1/14* (2006.01)

(52) U.S. Cl. ......................................................... 430/5

(58) Field of Classification Search ....................... 430/5
See application file for complete search history.

(56) References Cited

U.S. PATENT DOCUMENTS

| | | | | |
|---|---|---|---|---|
| 4,816,361 A | * | 3/1989 | Glendinning | 430/5 |
| 5,411,824 A | * | 5/1995 | Vasudev et al. | 430/5 |
| 5,530,265 A | * | 6/1996 | Takemura | 257/66 |
| 5,786,114 A | * | 7/1998 | Hashimoto | 430/5 |
| 5,994,157 A | * | 11/1999 | Aggas et al. | 438/30 |
| 6,020,590 A | * | 2/2000 | Aggas et al. | 250/370.09 |
| 2003/0193068 A1 | * | 10/2003 | Yeh | 257/347 |
| 2006/0051974 A1 | * | 3/2006 | French et al. | 438/764 |

FOREIGN PATENT DOCUMENTS

WO    WO 9417450 A1 *  8/1994

OTHER PUBLICATIONS

Grant, Roger and Claire, Grant & Hackh's Chemical Dictionary, Fifth Edition, 1987, McGraw-Hill, Inc., pp. 261 and 487.*

* cited by examiner

*Primary Examiner*—Mark F Huff
*Assistant Examiner*—John Ruggles
(74) *Attorney, Agent, or Firm*—Turocy & Watson, LLP

(57) ABSTRACT

A mask is provided to be used with nanoprint lithography processes to facilitate reproduction of small features required for the production of integrated circuits. A translucent substrate is provided along with one or more three-dimensional features that include one or more vertical sidewalls. An absorbing material is deposited upon one or more of the vertical sidewalls so that light in an incident direction to an upper surface of the substrate will be absorbed by the absorbing material, resulting in light blocking features. One or more horizontal surfaces are formed upon one or more of the three-dimensional features, which allow light rays to exit a lower surface of the substrate unobstructed by the absorbing material.

8 Claims, 6 Drawing Sheets

MASK HAVING SIDEWALL ABSORBERS TO ENABLE THE PRINTING OF FINER FEATURES IN NANOPRINT LITHOGRAPHY (1XMASK)

FIELD OF THE INVENTION

The present invention generally relates to semiconductor processing and, more particularly, to a system and method for extending resolution of and production of small features achievable in nanoprint lithography.

BACKGROUND OF THE INVENTION

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller feature sizes are required. This includes the width and spacing of interconnecting lines, spacing and diameter of contact holes, and the surface geometry, such as corners and edges, of various features. The dimensions of and between such small features can be referred to as critical dimensions. With an ever increasing number of integrated circuit features being formed on a circuit die, the importance of properly designing patterns to form structures that are isolated and non-interfering with one another has also increased.

The requirement of small features with close spacing between adjacent features requires high resolution lithographic processes. In general, lithography refers to processes for pattern transfer between various media. It is a technique used for integrated circuit fabrication in which a silicon structure is coated uniformly with a radiation-sensitive film (a resist or a lithographic coating) and an exposing source (such as optical light, x-rays, or an electron beam) illuminates selected areas of the coated silicon structure through an intervening master template. The intervening master template is generally known as a mask, photomask, or reticle for a particular pattern. The lithographic coating is generally a radiation-sensitive coating suitable for receiving a projected image of the subject pattern. Once the image is projected, it is indelibly formed in the coating. The projected image may be either a negative image or a positive image of the subject pattern. Exposure of the coating through a reticle, mask or photomask causes the image area to become either more or less soluble (depending on the coating) in a particular solvent developer. The more soluble areas are removed in the developing process to leave the pattern image in the coating as less soluble polymer.

The process of manufacturing semiconductors (e.g., integrated circuits, ICs, chips) employing masks typically consists of more than a hundred steps, during which hundreds of copies of an integrated circuit may be formed on a single wafer. Generally, the process involves creating several patterned layers on and into the substrate that ultimately forms the complete integrated circuit. The patterned layers are created, in part, by the light that passes through the masks. A series of lenses provides for reduction in size from the mask to the projected image onto the resist. The optical equipment for traditional photolithographic processes requires significant capital investment.

Nanoprint (also know as nanoprint lithography, imprint lithography, nanoimprint or nanoimprint lithography) technologies are emerging which provide an alternative in which the capital investment is significantly reduced in part because patterns are exposed through a 1:1 mask in close proximity to the wafer. Imprint lithography is relatively inexpensive because it avoids costly optics, as well as cumbersome enhancement techniques like phase-shift masks. Capital cost for equipment is far less than typical step-and-scan or scan and repeat systems. Imprint lithography does not depend on optical elements; rather, the line width is determined solely by the mask or mold.

In a conventional nanoprint process a UV-transmittable quartz mask/mold is pressed into a thin film of low viscosity UV-curable monomer coated onto a substrate. Subsequent exposure of the substrate by UV-irradiation through the mask/mold results in polymerization and curing of the resist in the imprinted area. Thereafter the mold is removed leaving an inverted three-dimensional replica of its pattern into the cured imprint polymer. Finally, the residual imprint layer in the depressed areas is removed by high anisotropic reactive ion etching. One advantage is that the circuit designers do not need to be concerned about optical proximity correction which otherwise limits how patterns are placed on the mask. Furthermore, patterning on top of a grating or other surfaces with severe topological features is possible providing significant advantages in MEMS applications.

Because nanoprint lithographic methods do not utilize the typical 4× optical reduction employed in conventional lithographic processes, the small feature sizes are more difficult to achieve. In order to produce devices with similar critical dimensions to conventional optical lithographic methods, new processes and techniques are required.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A system and method are provided to extend the resolution normally achievable with nanoprint lithographic processes. The present invention facilitates the reproduction small features required for the production of integrated circuits. The present invention provides for creation of a translucent mask (or mold) with three-dimensional features. The vertical dimension of the three-dimensional features can be characterized as having sidewalls. The present invention provides for depositing an ultraviolet light absorbing or other radiation absorbing material as a thin film onto the surface of the mask or mold. In accordance with one aspect of the present invention the light absorbing material is deposited by chemical vapor deposition (CVD). In one embodiment, the light absorbing material is SiON. Other embodiments in include Si-rich nitride. Si-rich oxide, SiOC, SiOCN, TiN and other similar light absorbing materials. In accordance with another aspect of the invention, the light absorbing materials can be deposited by physical vapor deposition (PVD). Materials like TiN are deposited by PVD processes.

After deposition of a light absorbing film or coating, the mask or mold is further processed by etching or other similar techniques to remove the absorbing material from all horizontal surfaces, leaving only a thin coating of the absorbing material on the vertical sidewalls of the three-dimensional features. When the mask is used to facilitate exposure of a resist coated substrate, light which is incident upon the mask will be impacted by the light absorbing materials deposited on the sidewalls of the features. Light which is incident upon the light absorbing materials deposited on the sidewalls of the features on the mask will be absorbed by the light absorbing materials. However, light which is incident upon the horizontal surfaces, on which the light absorbing material has been removed, will pass through mask relatively unaltered. Consequently, when a resist layer of a substrate is exposed by light passing through the mask, areas of the resist layer corresponding to locations of the vertical sidewalls of the mask will not be exposed while the balance of the resist layer will be exposed as the remaining light passes through the mask unobstructed. Exposure of the resist coated substrate leaves the resist either more soluble or less soluble in a particular solvent depending upon the resist. Further development of the resist and processing of the substrate results in either the removal or the retention of small areas corresponding to the thickness of the light absorbing materials deposited on the sidewalls of the features on the mask. Additional processing completes devices comprising small features.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention will now be described with reference to the drawings. The following detailed description is of the best mode presently contemplated by the inventors for practicing the invention. It should be understood that the description of these aspects are merely illustrative and that they should not be taken in a limiting sense.

As used in this application, the terms "mask", "photomask" and "mold" are used interchangeably to refer to an article comprising a master pattern used to shield selected areas of a surface from exposure by a radiation source utilized in the production of an integrated circuit. The terms "nanoprint", "nanoprint lithography", "nanoimprint", and "nanoimprint lithography" are used interchangeably to describe a method of producing integrate circuits involving imprinting a pattern onto a resist and subsequent exposure by a source, typically ultraviolet light, to which the resist is reactive.

The present invention provides a system and method to extend the resolution normally achievable with nanoprint lithographic processes. The present invention facilitates the reproduction small features required for the production of integrated circuits. In accordance with one aspect of the present invention, a translucent mask (or mold) is provided with light absorbing material deposited on the sidewalls of three-dimensional features.

Figure 1:
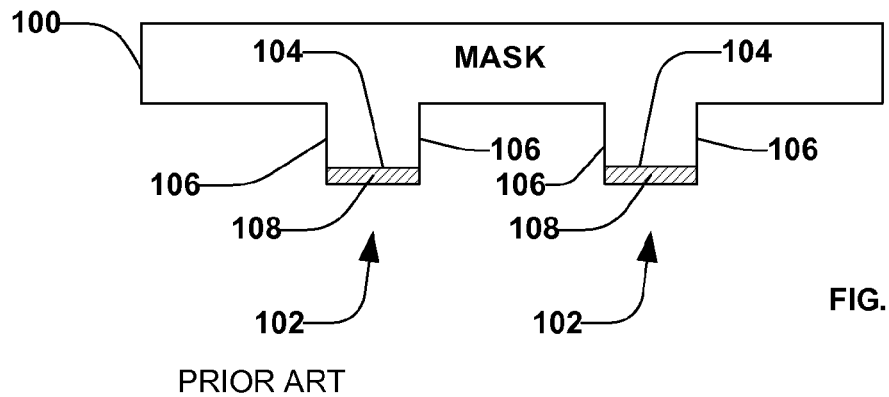
FIG. 1 is an illustration of a typical mask utilized in a nanoprint lithographic process.

FIG. 1 is an illustration of a cross section of a conventional mask 100 utilized to transfer a master pattern to a semiconductor wafer in a nanoprint process. Mask 100 is a comprised of translucent material such as quartz or silicon dioxide. Mask 100 may comprise any combination of translucent and opaque materials used for pattern transfer in a nanoprint process. In the illustrated example, mask 100 is comprised of one or more three-dimensional features 102. These three-dimensional features are utilized with nanoprint techniques to facilitate pattern transfer from the mask to a coated substrate. Features 102 are comprised of horizontal surfaces 104 and vertical surfaces 106. Vertical surfaces 106 can also be described and referred to as sidewalls 106. In the illustrated example, an opaque material 108 is deposited on the horizontal surfaces 104 of features 102; the balance of the mask is translucent.

Figure 2:
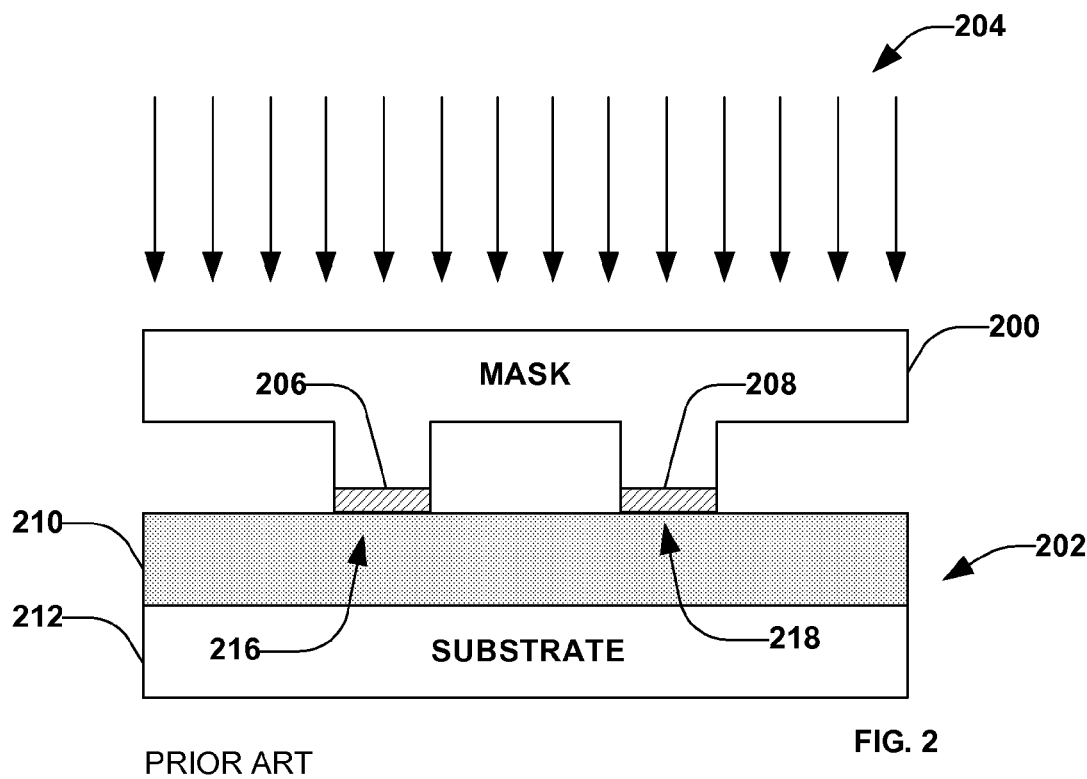
FIG. 2 is an illustration of a substrate being subjected to an exposure though a mask in a nanoprint lithographic process.
Figure 3:
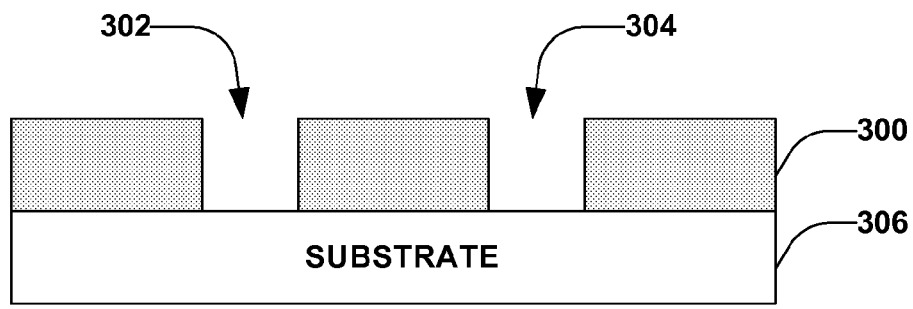
FIG. 3 is an example of a resulting substrate after exposure though a mask in a nanoprint lithographic process.

FIG. 2 illustrates a conventional nanoprint mask 200 used in close proximity to a resist covered silicon substrate 202 to facilitate pattern transfer from the mask to the substrate. In FIG. 2, a series of light rays 204 are incident on mask 200. Mask 200 is a translucent quartz material with two light blocking features 206 and 208. As the series of light rays 204 pass through the translucent mask 200, those light rays which do not encounter the light blocking features exit the mask and expose portions of resist layer 210 which has been deposited upon silicon substrate 212. Exposure of the resist layer 210 to light causes the exposed portions of the resist to harden and become insoluble. Those light rays which do encounter light blocking features 206 and 208 are blocked and therefore do not exit the mask. This leaves resist areas 216 and 218 which are directly underneath the light blocking features 206 and 208 unexposed. These unexposed areas remain relatively soft and can be subsequently removed in an etching or other similar process. The resultant product is illustrated in FIG. 3 where resist layer 300 has two channels 302 and 304 on top of substrate 306. A 1:1 pattern transfer ratio is employed between the mask and the substrate and the critical dimensions of the resulting channels are a direct function of the dimensions of the light blocking features on the mask.

Figure 4:
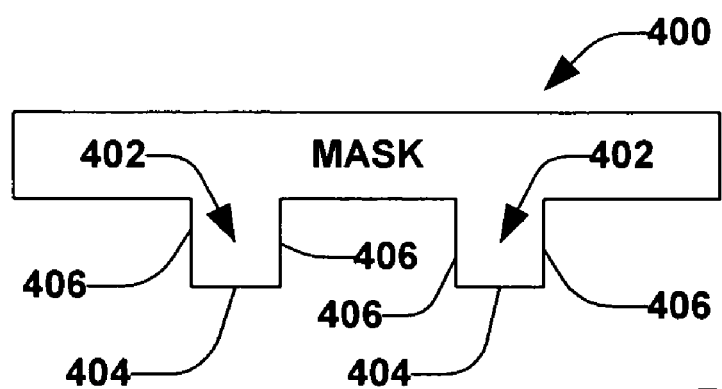
FIG. 4 is an illustration of a translucent mask comprised of horizontal surfaces and vertical sidewalls in accordance with an aspect of the present invention.

In accordance with one aspect of the present invention, smaller feature sizes are achievable in silicon substrates processed with nanoprint lithography techniques by depositing a light absorbing material onto the sidewalls of three-dimensional features patterned onto a mask. The starting point is a translucent mask onto which an appropriate pattern master is created. FIG. 4 is an illustration of a cross section of a mask 400 utilized to transfer a master pattern to a semiconductor substrate utilizing a nanoprint lithography process. Mask 400 is a comprised of a translucent material such as quartz or silicon dioxide. It is to be understood that mask 400 may comprise any combination of translucent materials used for pattern transfer in nanoprint lithography processes. Mask 400 is comprised of one or more, three-dimensional features 402. These three-dimensional features are utilized with nanoprint lithography techniques to achieve pattern transfer from the mask to a coated substrate. Features 402 are comprised of horizontal surfaces 404 and vertical surfaces 406. Vertical surfaces 406 can also be described as and referred to as sidewalls 406. In the illustrated example, the entire mask 400 is translucent, there are no light blocking features.

Figure 5:
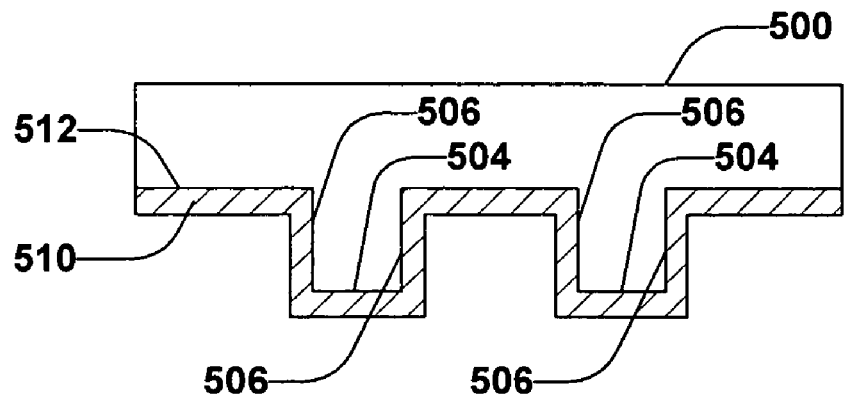
FIG. 5 is an illustration of a translucent mask comprised of horizontal surfaces and vertical sidewalls after deposition of an absorbing material in accordance with an aspect of the present invention.

In accordance with one aspect of the present invention, a light absorbing material is deposited onto the surface of a mask in order to facilitate the pattern transfer of smaller feature sizes. FIG. 5 illustrates a mask 500 which has absorbing material 510 deposited onto the lower surface 512 of the mask. In accordance with one aspect of the present invention, absorbing material 510 is deposited by chemical vapor deposition (CVD). In one embodiment of material deposited by CVD, material 510 is SiON. In other embodiments, absorbing material 510 is Si-rich nitride, Si-rich oxide, SiOC, SiOCN, or TiN. In accordance with another aspect of the invention, absorbing material 510 is deposited by physical vapor deposition (PVD). In one embodiment of material deposited by PVD, absorbing material 510 is TiN. It is understood that absorbing material 510 can be any absorbing or blocking material capable of absorbing, blocking or otherwise inhibiting the transmission of incident radiation utilized in lithographic processes and which also maybe be deposited by CVD or PVD.

Referring again to FIG. 5, absorbing material 510 is deposited upon the entire lower surface 512 of mask 500. This includes horizontal surfaces 504 and vertical surfaces, or sidewalls 506. In accordance with another aspect of the invention, after the absorbing material has been deposited upon the mask, a portion of the absorbing material is removed by etching or other appropriate techniques. In accordance with one aspect of the invention, all absorbing material is removed from all horizontal surfaces leaving absorbing material only upon one or more of the vertical sidewalls of the features. It is understood that the absorbing material may be left on as few as one vertical sidewall or as many as all of the vertical sidewalls which comprise the mask. The relatively thin coating of absorbing material which remains upon the sidewall of the features provides a much smaller cross sectional area than the cross sectional area of the three-dimensional feature itself.

Figure 6:
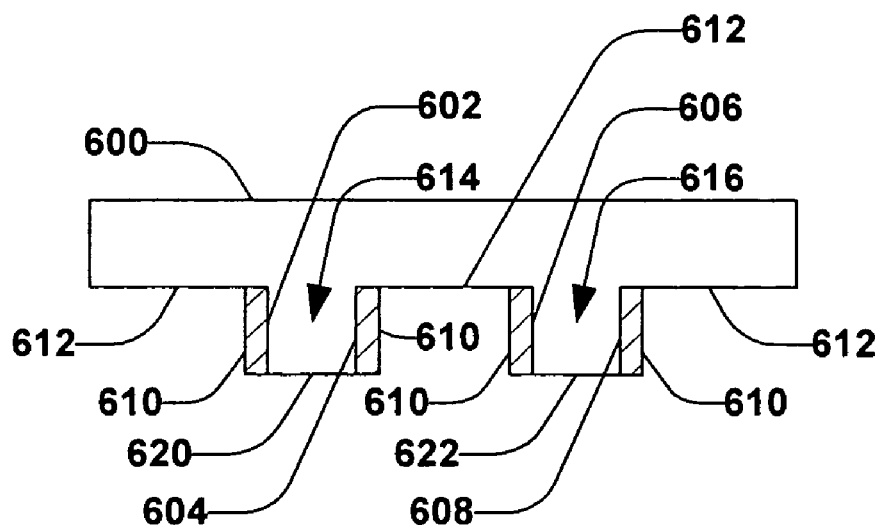
FIG. 6 is an illustration of a translucent mask comprised of horizontal surfaces and vertical sidewalls after deposition of an absorbing material and subsequent removal of the absorbing material from all horizontal surfaces in accordance with an aspect of the present invention.

This is illustrated in FIG. 6. FIG. 6 is an illustration of mask 600 where absorbing material has been removed from all horizontal surfaces and has been left deposited upon all vertical sidewalls. Mask 600 has vertical sidewall surfaces 602, 604, 606 and 608. Each of these sidewalls has a thin layer of absorbing material 610 deposited upon its surface. The absorbing material has been removed from all horizontal surfaces 612, 620 and 622. The resulting mask 600 has four areas wherein light incident upon the mask will encounter an absorbing material, the balance of the mask being translucent and transmissive for incident light. Absorbent materials deposited through CVD or PVD on the vertical sidewalls of features provide a smaller cross sectional area of absorbing material than is otherwise attainable. The resulting cross sectional areas of the absorbing material on sidewalls 602, 604, 606, and 608 is smaller than the cross sectional areas of achievable by providing an opaque or absorbing material upon the lower horizontal surfaces 620 and 622 of features 614 and 616.

Figure 7:
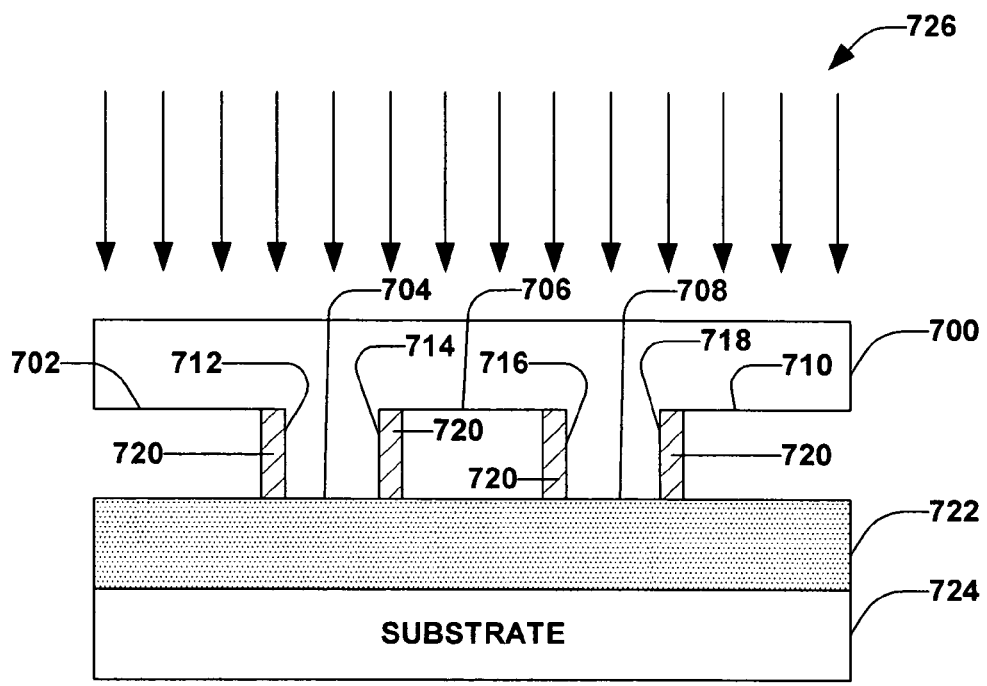
FIG. 7 is an illustration of a substrate subjected to exposure through a mask which has been produced in accordance with an aspect of the present invention.

FIG. 7 illustrates the utilization of a resultant mask 700 comprising absorbing material deposited and subsequently removed from all horizontal surfaces, leaving only absorbing material deposited upon all vertical sidewalls. Mask 700 is comprised of lower horizontal surfaces 702, 704, 706, 708 and 710. Mask 700 is further comprised of features with vertical sidewalls 712, 714, 716 and 718. A relatively thin coating of absorbing material 720 is deposited on each of the vertical sidewalls 712, 714, 716, and 718. Mask 700 is positioned in close proximity to resist layer 722 which is deposited upon silicon substrate 724. It is understood that mask 700 may be placed in close proximity to resist layer 722, maybe be placed in physical contact with layer 722, or may be place against resist layer 722 with a low pressure applied between the two surfaces. Light rays 726 are incident upon the entire upper surface of mask 700.

Figure 8:
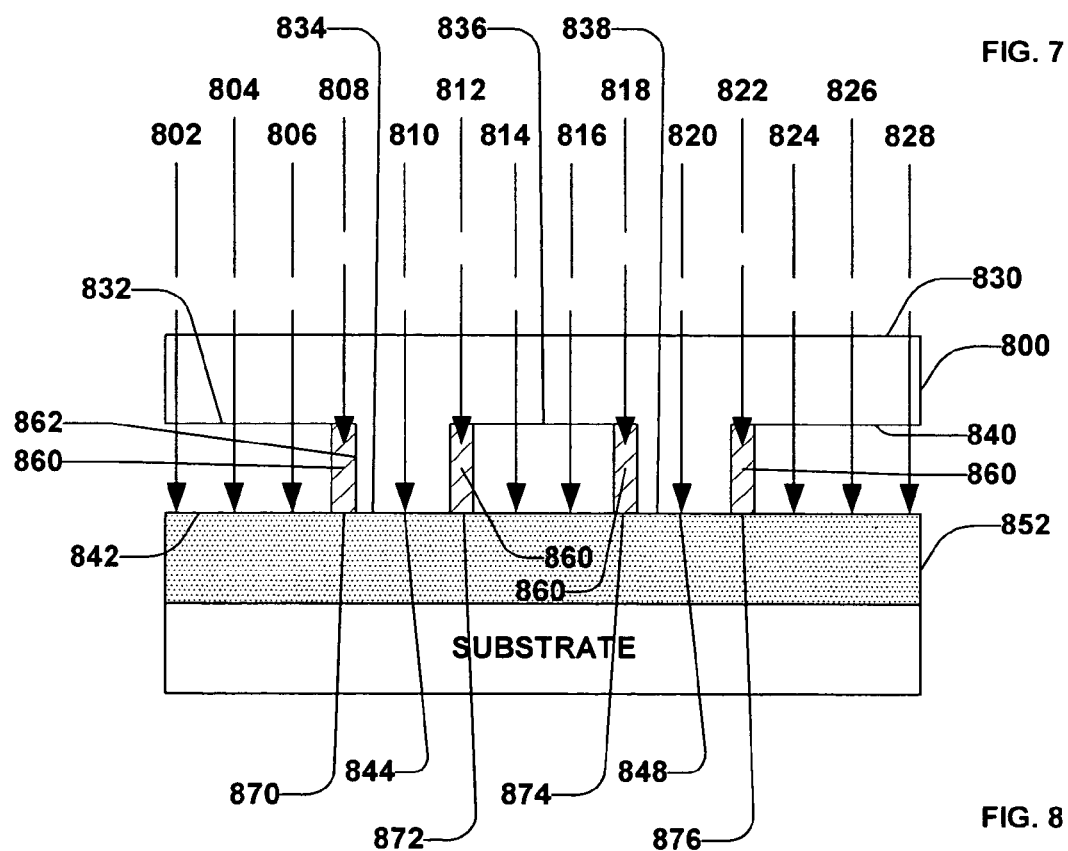
FIG. 8 is an illustration of the impact on exposure of absorbing material deposited upon the vertical sidewalls in accordance with an aspect of the present invention.

FIG. 8 illustrates the effect of the absorbing material deposited in specified areas of the mask upon the light which is incident upon the mask. In FIG. 8, light rays are incident upon the entire upper surface 830 of mask 800. The majority of the light as represented by light rays 802, 804, 806, 810, 814, 816, 820, 824, 826 and 828 passes through the translucent substrate uninterrupted. For example, light rays 802, 804, and 806 enter mask 800 at the upper surface 830 of the mask. These light rays pass through the translucent mask and exit the lower surface 832 of the mask unobstructed by any light blocking absorbing material or light features. These lights rays continue after exiting mask 800 at lower surface 832 and expose resist 852 at location 842. A similar situation exists for light rays 810, 814, 816, 820, 824, 826 and 828.

However, the situation is different for light rays 808, 812, 818 and 822. Each of these light rays enters the translucent substrate 800 at its upper surface 830. However, instead of passing through the mask uninterrupted, each of these light rays is absorbed by light absorbing material 860 which has been deposited on the sidewalls of features on the mask. For example, light ray 808 enters mask 800 through the upper surface 830 of the mask. The light passes through the upper portion of the mask until it is absorbed by light absorbing material 860 which has been deposited onto sidewall 862. The situation for light rays 812, 818 and 822 are all similar in that each light ray encounters light absorbing material 860 deposited onto the sidewall of a three-dimensional feature. As a result, the portions of resist 852 located directly below the light absorbing material deposited onto the sidewalls of the three dimensional features are not exposed by light. In FIG. 8, the unexposed areas are 870, 872, 874 and 876.

Figure 9:
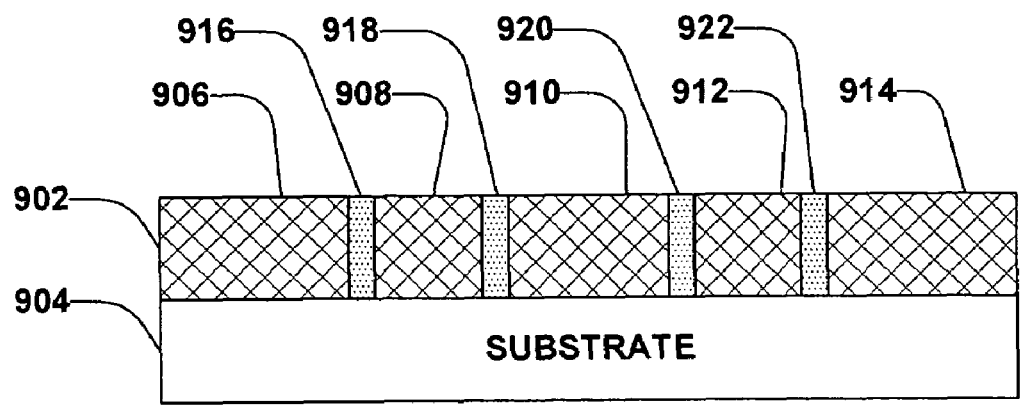
FIG. 9 is an illustration of a resist covered substrate after exposure to a source through a mask produced in accordance with an aspect of the present invention.

FIG. 9 is an illustration of the resulting pattern which is exposed onto the layer of resist 902 deposited upon substrate 904. Areas 906, 908, 910, 912 and 914 have all been exposed by the light passing through the mask. Areas 916, 918, 920 and 922 have not been exposed because the light which would have been incident upon these areas has been absorbed by the absorbing material deposited upon the sidewalls of the features in the mask.

Figure 10:
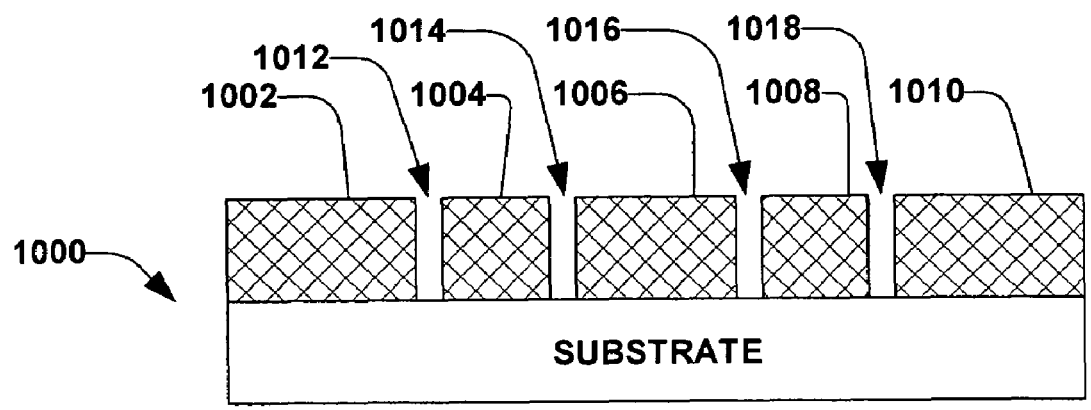
FIG. 10 is another illustration of a resist covered substrate after exposure to a light source through a mask produced in accordance with an aspect of the present invention.

After developing the resist, the unexposed areas are removed by ion etching or other suitable processes well known in the art and the resultant substrate 1000 is shown in FIG. 10. Exposed resist areas 1002, 1004, 1006, 1008, and 1010 are all retained while areas 1012, 1014, 1016 and 1018 result from removal of the resist.

Figure 11:
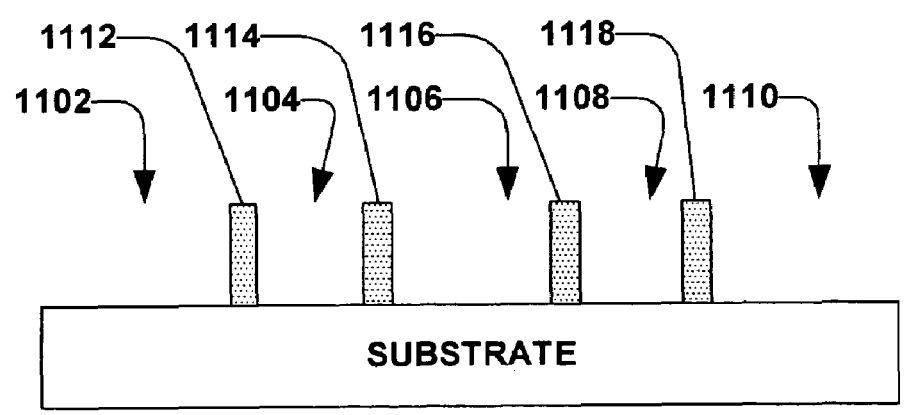
FIG. 11 is illustration of another resist covered substrate after exposure to a light source through a mask produced in accordance with an aspect of the present invention.

It is understood that the resist may be either a positive or a negative resist and that depending upon the type of resist used and subsequent development and etching, that either the unexposed areas or the exposed portions of the exposed resist may be removed. For example, in FIG. 11 it is the exposed areas 1102, 1104, 1106, 1108 and 1110 that have been removed and only the unexposed areas 1112, 1114, 1116, and 1118 that have been retained.

Figure 12:
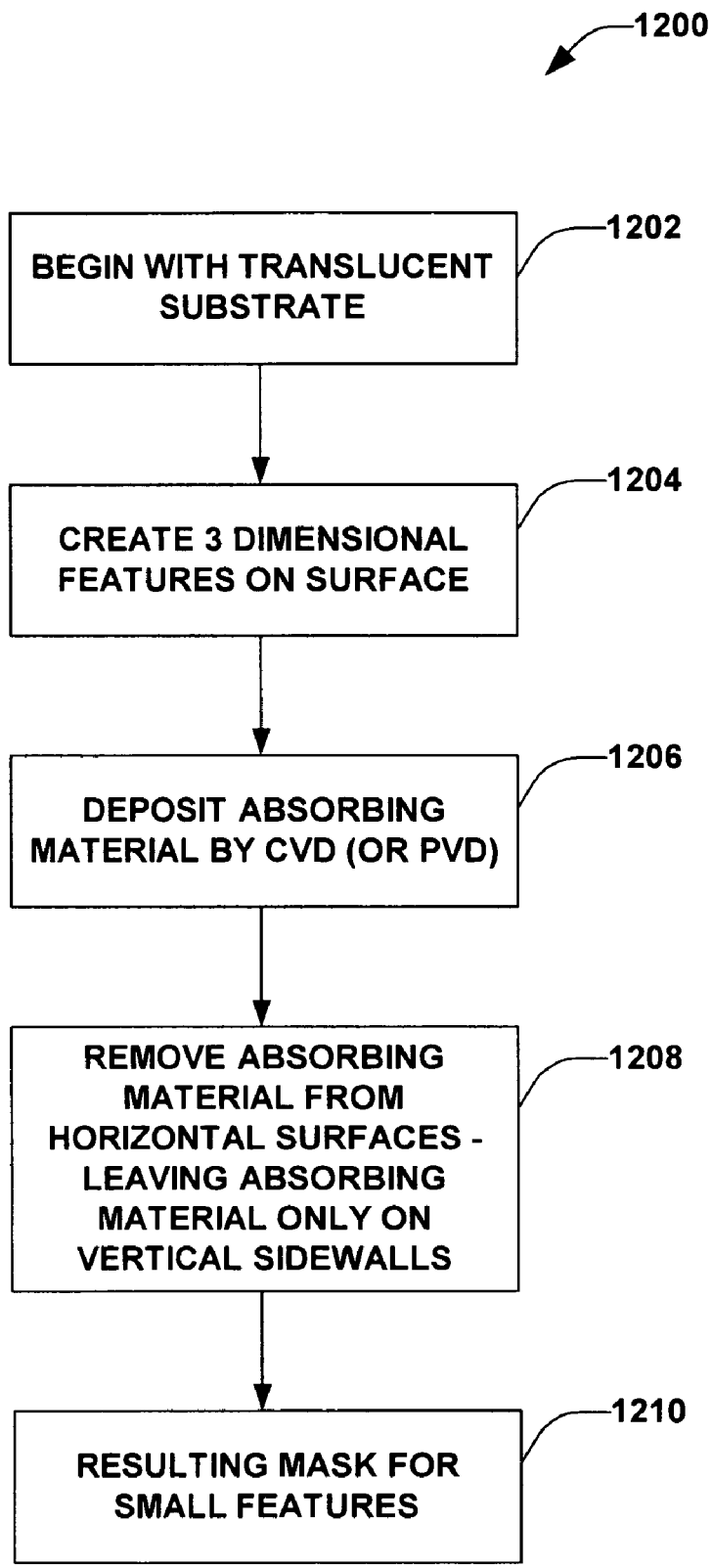
FIG. 12 is an illustration of a methodology to produce a mask with absorbing material deposited upon vertical sidewalls of features in accordance with an aspect of the present invention.
Figure 13:
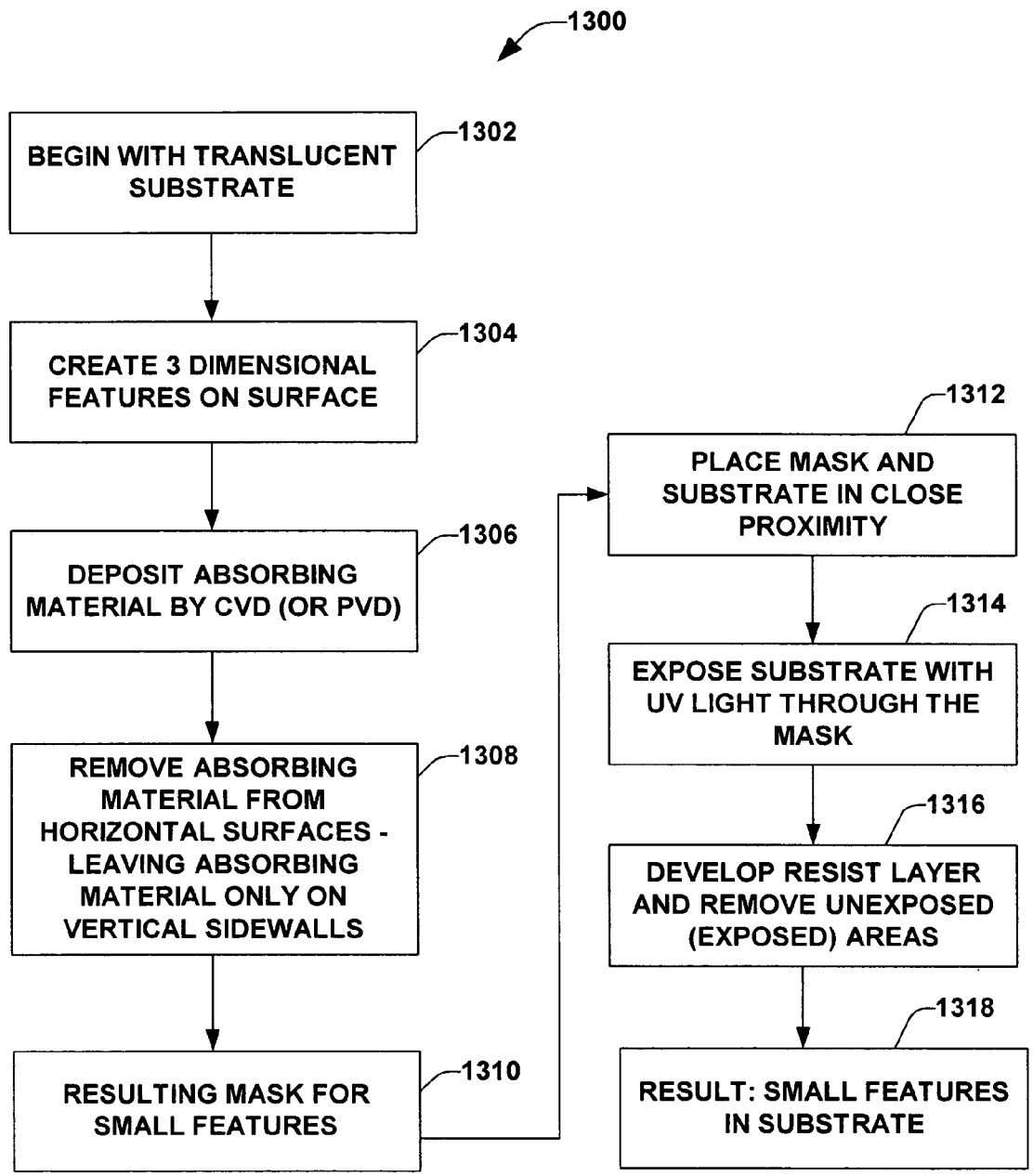
FIG. 13 is an illustration of a methodology to produce a substrate with small features utilizing a mask produced in accordance with an aspect of the present invention.

In view of the foregoing structural and functional features described above, methodologies in accordance with various aspects of the present invention will be better appreciated with reference to FIGS. 12 and 13. While, for purposes of simplicity of explanation, the methodologies of FIGS. 12 and 13 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 12 illustrates one particular methodology 1200 for creating a mask implemented in accordance with the present invention. The methodology 1200 begins at 1202 with a translucent substrate. At 1204, a three-dimensional pattern is created on the translucent substrate. The process continues at 1206 where absorbing material SiON is deposited upon the patterned surface of the substrate by chemical vapor deposition. It is understood that the material deposited by CVD may be any light absorbing material such as Si-rich nitride, Si-rich oxide, SiOC, SiOCN, TiN or other similar materials. Alternatively, at 1206 an absorbing material may be deposited by physical vapor deposition. An example of one such absorbing material is TiN, however, it is understood that any light absorbing material suitable for PVD may be utilized. At 1208, the absorbing material is removed from the horizontal surfaces of the pattern leaving absorbing material deposited only on the vertical sidewalls of the three-dimensional features. The result at 1210 is a mask suitable for use in nanoprint lithography capable of reproducing patterns with features smaller than otherwise achievable by conventional nanoprint methods.

FIG. 13 illustrates another particular methodology 1300 implemented in accordance with the present invention. In methodology 1300, a mask is created in accordance with the methodology discusses herein and then utilized to expose a substrate which is further processed to obtain small features. The methodology 1300 begins at 1302 with a translucent substrate. At 1304, a three-dimensional pattern is created on the translucent substrate. The process continues at 1306 where absorbing material SiON is deposited upon the patterned surface of the substrate by chemical vapor deposition. It is understood that the material deposited by CVD may be any light absorbing material such as Si-rich nitride, Si-rich oxide, SiOC, SiOCN, TiN or other similar materials. Alternatively, at 1306 an absorbing material may be deposited by physical vapor deposition. An example of one such absorbing material is TiN, however, it is understood that any light absorbing material suitable for PVD may be utilized. At 1308, the absorbing material is removed from the horizontal surfaces of the pattern leaving absorbing material deposited only on the vertical sidewalls of the three-dimensional features. The result at 1310 is a mask suitable for use in nanoprint lithography capable of producing devices with features smaller than otherwise achievable by conventional methods. The process continues at 1312 where a substrate with appropriate monomer coating (resist layer) is placed in close proximity to the mask. It is understood that the mask and the monomer coated substrate may be placed in very close proximity to each other, may be physically touching each other, or that the mask may even be pressed with a very low pressure against the monomer coated substrate such that the three-dimensional features of the mask leave an imprint in the monomer layer of the substrate. Although the substrate is illustrated as being coated with a monomer, it is understood that the substrate may be coated with any suitable layer of resist which is reactive to subsequent exposure from an exposure source. Continuing at 1314, the monomer coated substrate is exposed by ultraviolet light which passes through the mask from a source. If a different material is used for the layer of resist, it is understood that the source is a suitable source of exposure to which the layer of resist is sensitive. After exposure, the process continues at 1316 where the layer of monomer or other resist is developed and the unexposed portions of the resist layer are removed. Alternatively, depending on the type of resist used, the exposed portions of the layer of resist may be removed. Subsequent processing by methods well understood in the art results at 1318 in a substrate comprising small features which directly correspond to the areas of absorbing material deposited upon the sidewalls of the mask.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A mask for a nanoprint lithographic process, comprising:
    a translucent material that transfers a pattern from the mask to a substrate when placed in physical contact with the substrate or when placed against the substrate with a predetermined low pressure applied there between;
    one or more three-dimensional features comprising one or more vertical sidewalls;
    an absorbing material deposited upon one or more of the vertical sidewalls so that light incident on an upper surface of the translucent material will be absorbed by the absorbing material, resulting in light blocking features such that upon the transfer of the pattern, the substrate comprises features which directly correspond to areas of the absorbing material deposited on the vertical sidewalls; and
    one or more horizontal surfaces, formed upon one or more of the three-dimensional features, that allow light rays to exit a lower surface of the substrate unobstructed by the absorbing material.

2. The mask of claim 1, the translucent material comprising silicon dioxide.

3. The mask of claim 1, the translucent material being quartz.

4. The mask of claim 1, the absorbing material comprising SiON.

5. The mask of claim 1, the absorbing material comprising Si-rich nitride.

6. The mask of claim 1, the absorbing material comprising Si-rich oxide.

7. The mask of claim 1, the absorbing material comprising SiOCN.

8. The mask of claim 1, the absorbing material comprising TiN.

* * * * *